United States Patent [19]
Nishioka et al.

[11] Patent Number: 5,530,253
[45] Date of Patent: Jun. 25, 1996

[54] SAMPLE STAGE FOR SCANNING PROBE MICROSCOPE HEAD

[75] Inventors: Tadashi Nishioka; Takao Yasue, both of Itami, Japan

[73] Assignees: Mitsubishi Denki Kabushiki Kaisha, Tokyo; Ryoden Semiconductor System Engineering Corporation, Hyogo, both of Japan

[21] Appl. No.: 319,243

[22] Filed: Oct. 6, 1994

[30] Foreign Application Priority Data

Oct. 26, 1993 [JP] Japan ................................ 5-267267

[51] Int. Cl.$^6$ ................................................ H01J 37/20
[52] U.S. Cl. ................................... 250/442.11; 250/306
[58] Field of Search .............................. 250/442.11, 306

[56] References Cited

U.S. PATENT DOCUMENTS

| | | | |
|---|---|---|---|
| 3,643,091 | 2/1972 | Lucas | 250/442.11 |
| 4,292,523 | 9/1981 | Hoppe | 250/442.11 |
| 4,587,431 | 5/1986 | Uemura | 250/442.11 |
| 4,837,445 | 6/1989 | Nishioka et al. | 250/442.11 |
| 4,879,467 | 11/1989 | Muller et al. | 250/442.11 |
| 4,947,042 | 8/1990 | Nishioka et al. | 250/306 |
| 5,303,035 | 4/1994 | Luecke et al. | 356/399 |

OTHER PUBLICATIONS

Ringger et al, "STM Activity at the University of Basel", IBM Journal of Research Development, vol. 30, No. 5, Sep. 1986, pp. 500–508.

Berghaus et al, "A Scanning Tunneling Microscope for the Investigation of the Growth of Metal Films on Semiconductor Surfaces" IBM Journal of Research Development, vol. 30, No. 5, Sep. 1986, pp. 520–524.

Chiang et al, "An Ultrahigh Vacuum Scanning Tunneling Microscope with Interchangeable Samples and Tips", Journal of Vacuum Science Technology, A 6(2), Mar./Apr. 1988, pp. 386–389.

Demuth et al, "A Simplified Scanning Tunneling Microscope for Surface Science Studies", Journal of Vacuum Science Technology, A 4(3), May/Jun. 1986, pp. 1320–1323.

Okano et al, "Vibration Isolation for Scanning Tunneling Microscopy", Journal of Vacuum Science Technology, A 5(6), Nov./Dec. 1987, pp. 3313–3320.

Bando et al., "Construction of a Low–Temperature STM with in situ Sample Cleavage", Ultramicroscopy 43–44.

Primary Examiner—Bruce C. Anderson
Attorney, Agent, or Firm—Leydig, Voit & Mayer

[57] ABSTRACT

A sample stage of a scanning probe microscope head is capable of changing the direction of a sample plane stably over a wide range in a simple operation. Fixtures fix both ends of an outer flexible tube of a flexible shaft. A displacement lead-in portion displaces one end of an inner flexible tube of the flexible shaft relative to the outer flexible tube, and a displacement lead-out portion and a coupling portion transmit the displacement led in the inner flexible tube of the flexible shaft to a sample carrier portion to turn the sample carrier portion about a turn axis, thereby getting a sample plane to change direction.

15 Claims, 21 Drawing Sheets

410

420

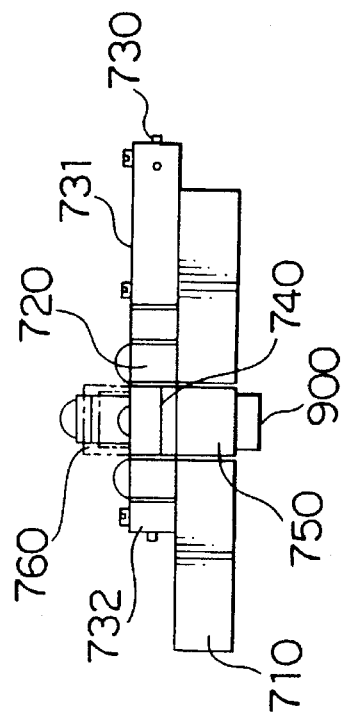
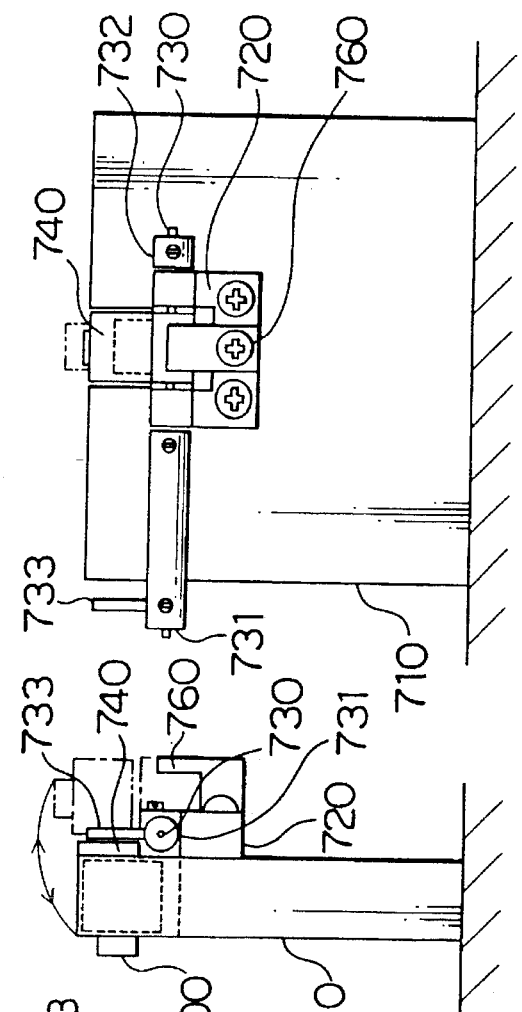
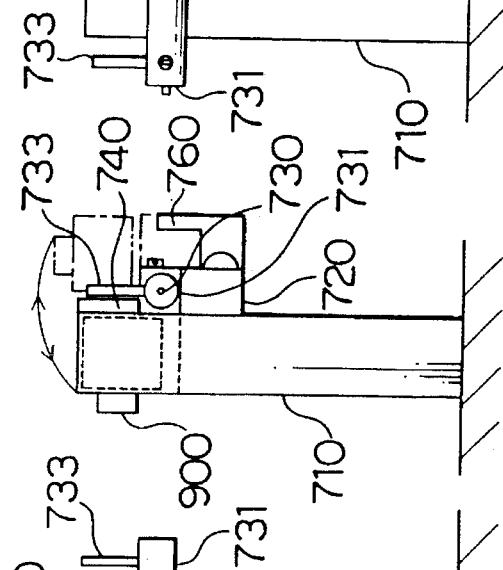
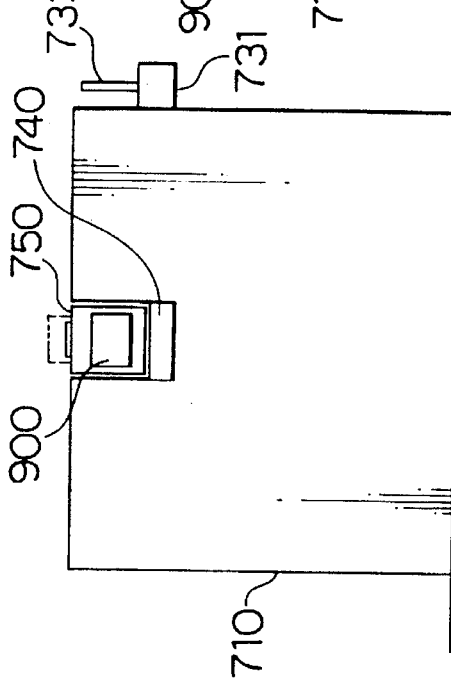

SAMPLE STAGE FOR SCANNING PROBE MICROSCOPE HEAD

BACKGROUND OF THE INVENTION

1. Field of the Invention

The present invention relates to a sample stage in the head of a scanning probe microscope, such as a scanning tunneling microscope (referred to as an STM hereinafter) or an atomic force microscope (referred to as an ATM hereinafter), and more particularly, to a sample stage capable of getting a sample plane to change direction by using a flexible shaft.

2. Description of the Related Art

STM head sample stages needed to coarsely focus on samples, heat sample planes and replace samples have been disclosed heretofore, for example, in the following documents:

1. M. Ringger, B. W. Corb., H. R. Hidber, R. Schlogl, R. Weisendanger, A. Stemmer, L. Rosenthaler, A. J. Brunner, P. C. Oelhafen and H. J. Gruntherodt: IBM J. Res. Develop., Vol. 30, No. 5, pp. 500–508, 1986.
2. Th. Berghaus, H. Neddermeyer and St. Tosch: IBM J. Res. Develop., Vol. 30, No. 5, pp. 520–524, 1986.
3. S. Chiang, R. J. Wilson, Ch. Gerber and V. M. Hallmark: J. Vac. Sci. Technol. A, Vol. 6, No. 2, pp.386–389, 1988.
4. J. E. Demuth, R. J. Hamers, R. M. Tromp and M. E. Welland: J. Vac. Sci. Technol. A, Vol. 4, No. 3, pp. 1320–1323, 1986.
5. M. Okano, K. Kajimura, S. Wakiyama, F. Sakai, W. Mizutani and M. Ono: J. Vac. Sci. Technol. A, Vol. 5, No. 6, pp. 1313–3320, 1987.
6. H. Bando, H. Tokumoto, A. Zettl and K. Kajimura: Ultramicroscopy, No. 42–44, pp. 1627–1631, 1992.

A typical example of such conventional sample stages is illustrated in FIG. 28. This sample stage has a plurality of piezoelectric plates 52 supported by three legs 51 and a sample carrier 53 mounted on one of the piezoelectric plates 52. The legs 51 are made to move like a looper by applying driving voltage to the piezoelectric plates 52, thereby getting a sample plane 53a to change direction. FIG. 29A illustrates another conventional sample stage. This sample stage is provided with a running arm 55 pivotally mounted to a movable rod 56 by a connecting pin 54, and a sample carrier 58 is formed at one end of the running arm 55. On the side of the other end of the running arm 55, a stopper 57 is fixed to the sample stage. In this sample stage, the direction of a sample plane 58a is changed by linearly moving the movable rod 56 upward together with the connecting pin 54 from the state shown in FIG. 29A and pivoting one end of the running arm 55, at which the sample carrier 58 is mounted, upward about the stopper 57 in contact with the other end of the running arm 55, as shown in FIG. 29B.

However, the above-mentioned conventional sample stages have the following problems. Since the sample plane 53a is moved-by extending and contracting the plural piezoelectric plates 52 by the voltage application in the sample stage shown in FIG. 28, it takes a long time to change the direction of the sample plane 53a over a wide range. Furthermore, the method of applying the drive voltage to the plural piezoelectric plates 52 is complicated, and the directional change is unstable since the coefficient of friction of the bottom surface of each arm 51 is liable to change.

On the other hand, in the sample stage illustrated in FIG. 29, since the running arm 55 is mounted pivotally in a vertical plane by the connecting pin 54, the direction of the sample plane 58a can be also changed only in a vertical plane.

SUMMARY OF THE INVENTION

The present invention aims to solve these problems, and it is an object of the present invention to provide a sample stage of a scanning probe microscope capable of changing the direction of a sample plane stably over a wide range in a simple operation.

In order to achieve the above object, there is provided a sample stage of a scanning probe microscope head of the present invention which is comprised of a flexible shaft including an inner flexible tube and an outer flexible tube, fixtures for fixing both ends of the outer flexible tube, a displacement lead-in portion for displacing one end of the inner flexible tube relative to the outer flexible tube, a sample carrier portion for holding a sample and changing the direction of a plane of the sample by turning about a turn axis, and a displacement transmitting means connected to the other end of the inner flexible tube for transmitting the displacement led into the inner flexible tube by the displacement lead-in portion to the sample carrier portion in order to turn the sample carrier portion about the turn axis.

BRIEF DESCRIPTION OF THE DRAWINGS

FIGS. 7A to 7D are respectively top, front, side and rear views of a sample carrier portion;

DESCRIPTION OF THE PREFERRED EMBODIMENTS

Embodiments of the present invention will now be described with reference to the drawings.

First Embodiment

Figure 1:
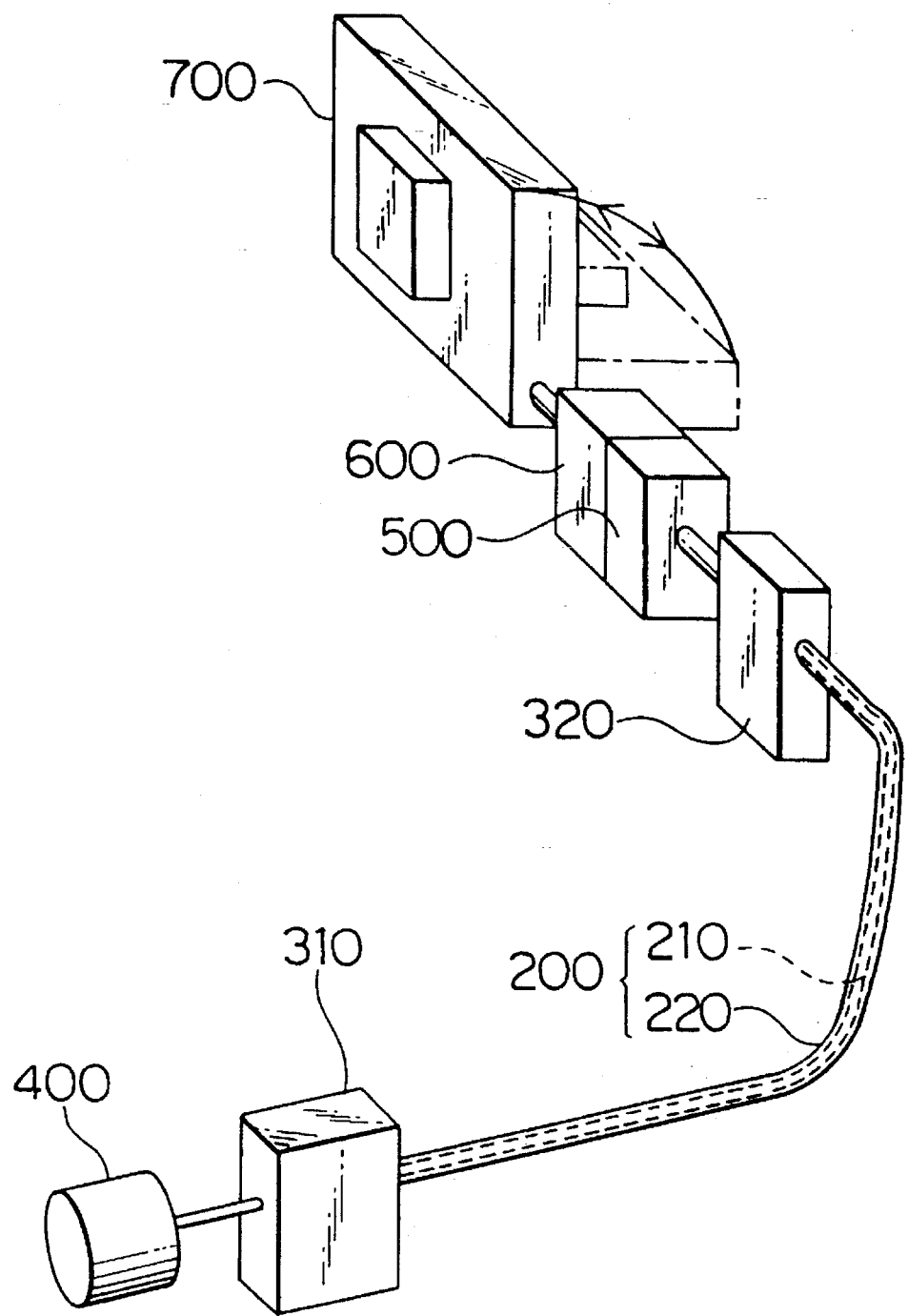
FIG. 1 is a perspective view of a sample stage of a scanning probe microscope head according to a first embodiment of the present invention.

FIG. 1 illustrates a sample stage of a scanning probe microscope head according to a first embodiment. Referring to FIG. 1, a flexible shaft 200 consists of an inner flexible tube 210 and an outer flexible tube 220, and both ends of the outer flexible tube 220 are fixed by fixtures 310 and 320. A displacement lead-in portion 400 and a displacement lead-out portion 500 are respectively connected to one end and the other end of the inner flexible tube 210. A sample carrier portion 700 is connected to the displacement lead-out portion 500 through a coupling portion 600. The displacement lead-out portion 500 and the coupling portion 600 constitute a displacement transmitting means of the present invention.

Figure 2:
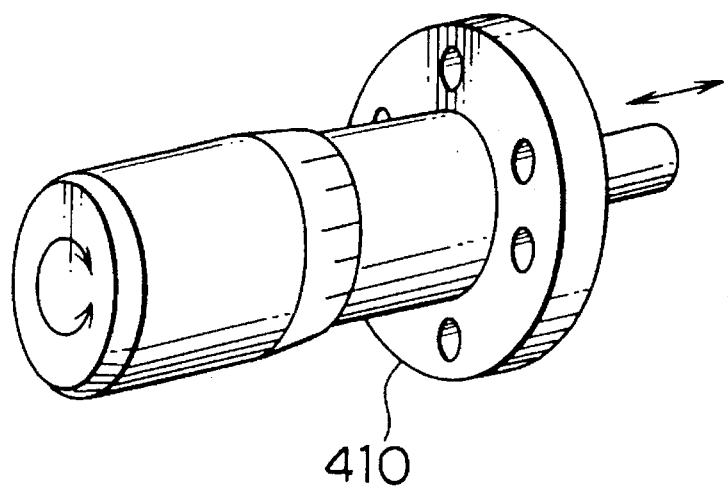
FIG. 2 is a perspective view of a linear lead-in device used as a displacement lead-in portion.
Figure 3:
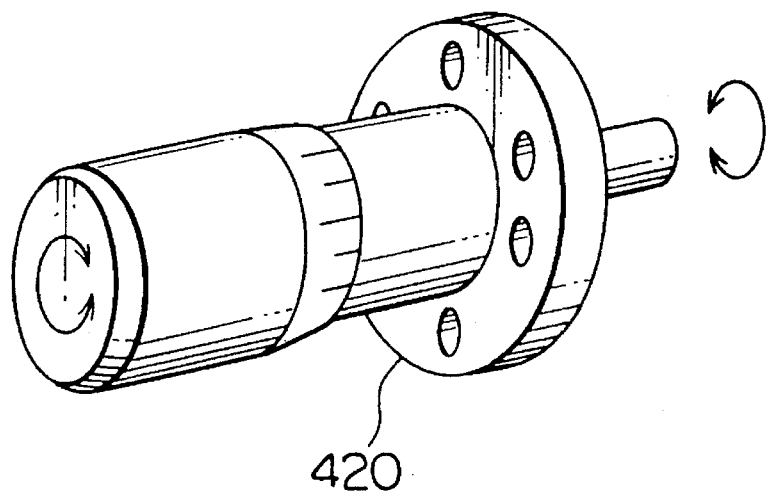
FIG. 3 is a perspective view of a rotary lead-in device used as the displacement lead-in portion.

The flexible shaft 200 has a structure in which the inner flexible tube 210 is inserted in the outer flexible tube 220, and transmits the rotational or linear motion through the displacement of the inner flexible tube 210 relative to the outer flexible tube 220. An ultra-high vacuum bellows linear or rotary lead-in device 410 or 420 shown in FIG. 2 or 3 is used as the displacement lead-in portion 400.

Figure 4:
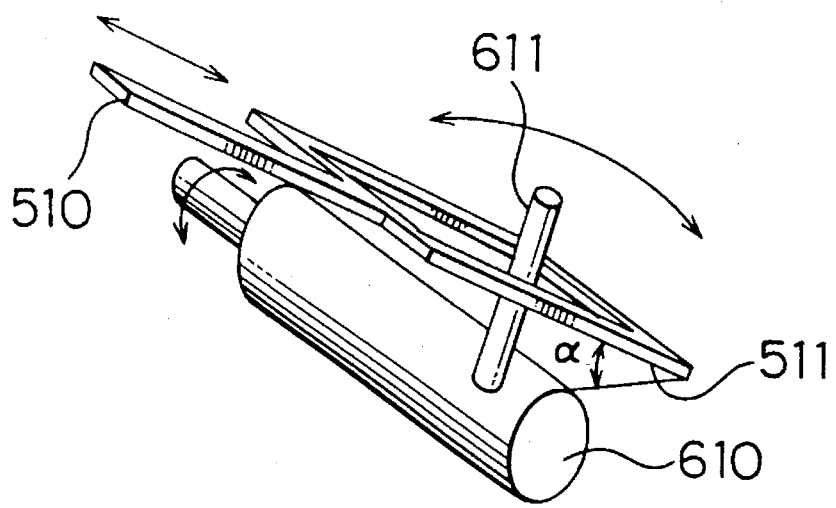
FIG. 4 is a perspective view of a linear displacement lead-out portion.

As the displacement lead-out portion 500 and the coupling portion 600, for example, a linear displacement lead-out device 510 and a linear coupling portion 610 shown in FIG. 4 can be used. The linear displacement lead-out device 510 has a catcher 511 having a square hole at an end thereof, and the linear coupling portion 610 has an engaging rod 611 to be fitted in the square hole of the catcher 511. The catcher 511 is inclined from the horizontal plane at an angle α almost equal to 45°, and the square hole thereof has such dimensions as to fit the engaging rod 611 therein even if the linear coupling portion 610 is turned at an angle of 90°. The catcher 511 and the engaging rod 611 are engaged with each other in correlation to the movement of the linear displacement lead-in portion 510, thereby converting the linear motion to the rotational motion. The mechanical engagement of the catcher 511 and the engaging rod 611 can be released by linearly moving the linear displacement lead-in portion 510 in the reverse direction and forming a void between the catcher 511 and the engaging rod 611.

Figure 5:
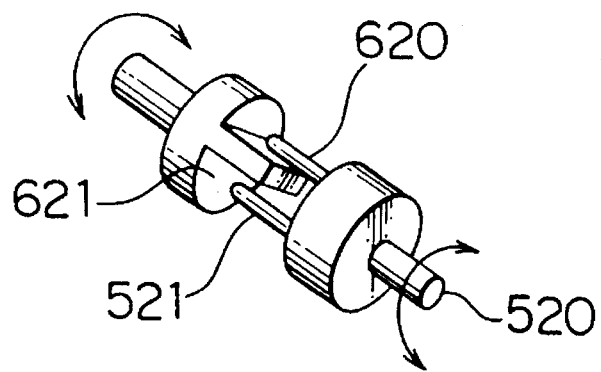
FIG. 5 is a perspective view of a rotary displacement lead-out portion.

As the displacement lead-out portion 500 and the coupling portion 600, for example, a rotary displacement lead-out device 520 and a rotary coupling portion 620 shown in FIG. 5 may be used. The rotary displacement lead-out device 520 is connected to the end of the inner flexible tube 210 and ends with two pins 521 embedded therein at the same distance from a center shaft of the inner flexible tube 210. The rotary coupling portion 620 is provided with a pull 621 to be inserted between the pins 521 at sufficient intervals. The rotation of the rotary displacement lead-in portion 520 is transmitted to the rotary coupling portion 600 through the pins 521 and the pull 621 as it is to turn the rotary coupling portion 600. The mechanical engagement of the pins 521 and the pull 621 can be released by turning the rotary displacement lead-out device 520 in the opposite direction and forming a void between the pins 521 and the pull 621.

Figure 6:
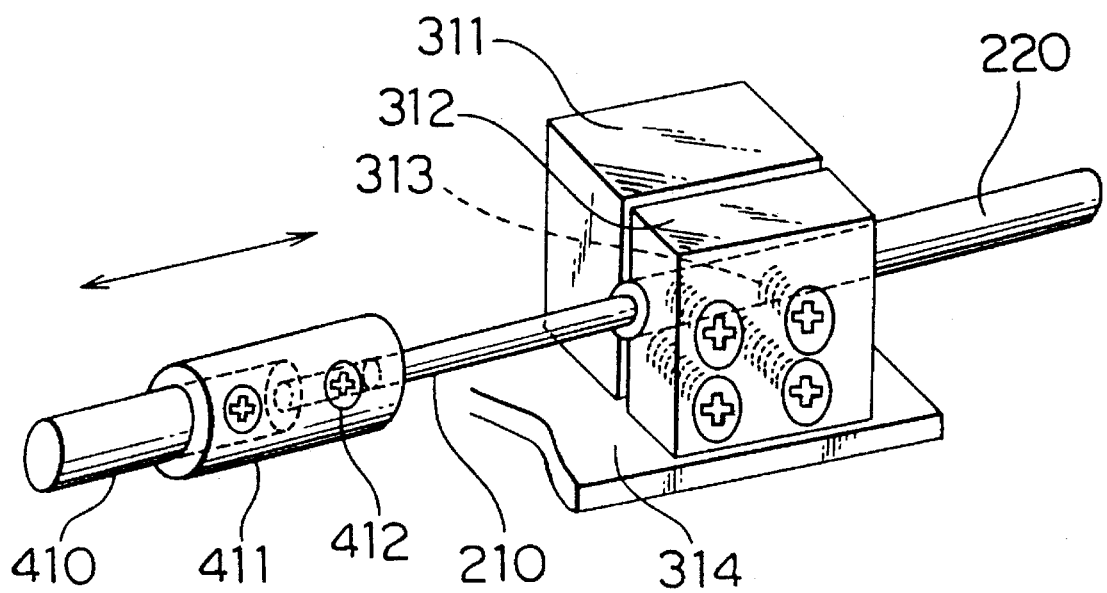
FIG. 6 is a perspective view of a fixture.

As shown in FIG. 6, the fixture 310 fixes the end of the outer flexible tube 220 between a pair of fixing members 311 and 312, which have respective slots formed on opposed planes thereof, by screws 313, and the fixing members 311 and 312 are fixed to a fixing plane 314 by screws or the like. The linear lead-in device 410 and the end of the inner flexible tube 210 are connected through a connector 411 and screws 412. The fixture 320 on the side of the displacement lead-out portion 500 has the same structure as that of the fixture 310 shown in FIG. 6.

FIGS. 7A to 7D are respectively top, front, side and rear views of the sample carrier portion 700 using the linear displacement lead-out device 510 shown in FIG. 4. A turn base fitting 720 is screwed to a frame 710, and a turn base 740 having a turn shaft 730 jointly with the turn base fitting 720 as a bearing is mounted. A sample carrier 750 for holding a sample 900 is laid on the turn base 740, and the turn base fitting 720 is provided with a turn base stopper 760 for restricting the excessive movement of the turn base 740. Furthermore, turn shaft fixtures 731 and 732 are mounted on the turn shaft 730 to prevent the turn shaft 730 from separating from the turn base fitting 720 and the turn base 740. A turn engaging rod 733 as a part of the linear coupling portion 610 is screwed into the turn shaft fixture 731.

Figure 8D:
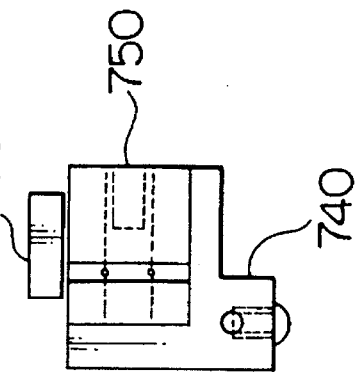
FIG. 8D is a side view showing a state in which the turn base is turned at an angle of 90°.
Figure 8C:
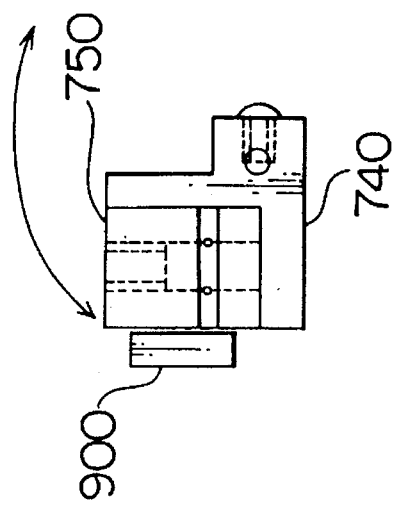
FIGS. 8A to 8C are respectively top, front and side views showing the relationship between a turn base and a sample carrier.
Figure 8A:
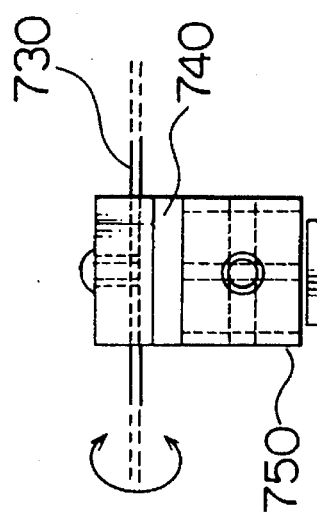
Figure 8B:
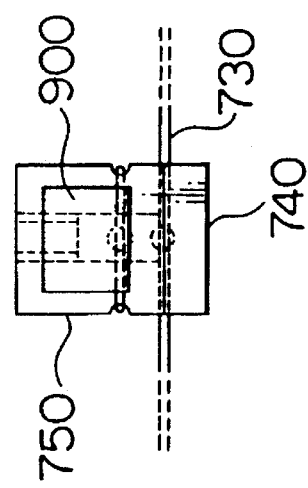

FIGS. 8A to 8C are respectively top, front and side views showing the relationship between the turn base 740 and the sample carrier 750. FIG. 8D is a side view showing a state in which the turn base 740 is turned at an angle of 90°.

Figure 9:
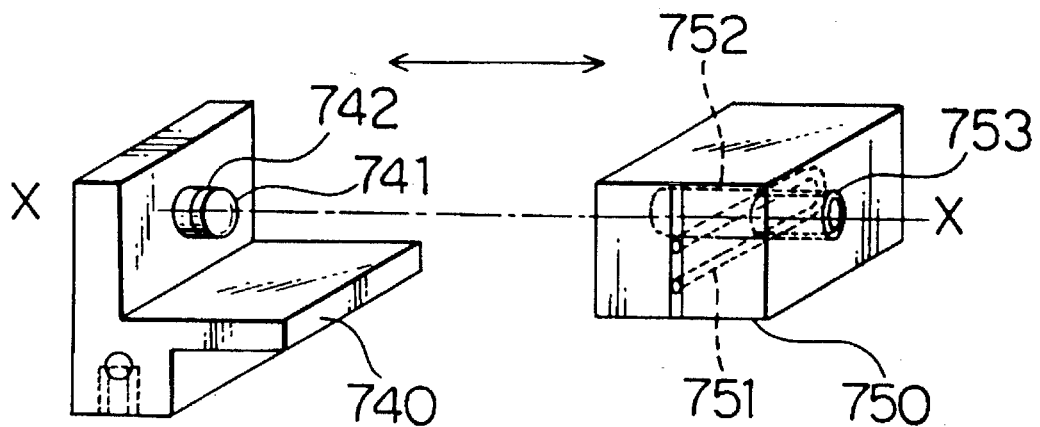
FIG. 9 is a perspective view showing how to mount the sample carrier on the turn base.
Figure 10:
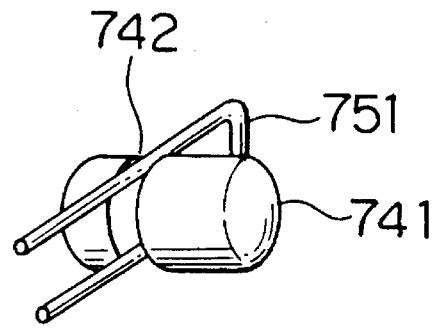
FIG. 10 is a partly enlarged view showing the sample carrier mounted on the turn base.

FIG. 9 is a perspective view explaining how to mount the sample carrier 750 to the turn base 740. A sample carrier insertion pin 741 having a neck slot 742 is screwed into the turn base 740 and a fitting hole 752 and a sample exchange female screw 753 are formed on the sample carrier 750. Furthermore, a U-shaped insertion pin presser spring 751 is inserted in a hole formed in the sample carrier 750 to be in contact with the inner surfaces of the fitting hole 752 and the sample exchange female screw 753. When the sample carrier 750 is moved toward the turn base 740 along an axis X—X, the insertion pin presser spring 751 is, as shown in FIG. 10, fitted in the neck slot 742 of the insertion pin 741, thereby connecting the turn base 740 and the sample carrier 750.

Figure 11A:
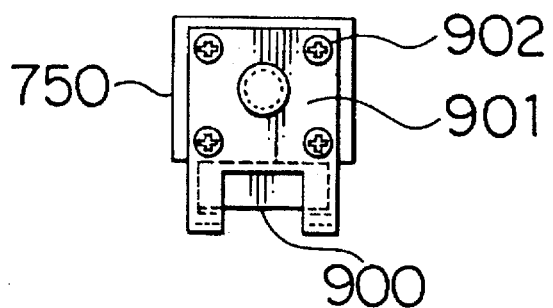
FIGS. 11A to 11C are respectively top, front and side views showing the relationship between the sample carrier and a sample.
Figure 11B:
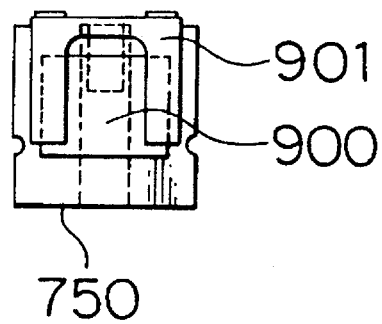
Figure 11C:
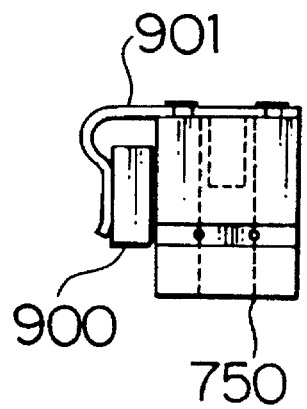

As shown in FIGS. 11A to 11C, the sample 900 is sandwiched between the sample carrier 750 and spring portions on both sides of a notch portion of a sample presser bar flat spring 901 fixed by bar flat spring screws 902, and pressed against the sample carrier 750 by elastic force of the spring portions.

Figure 12:
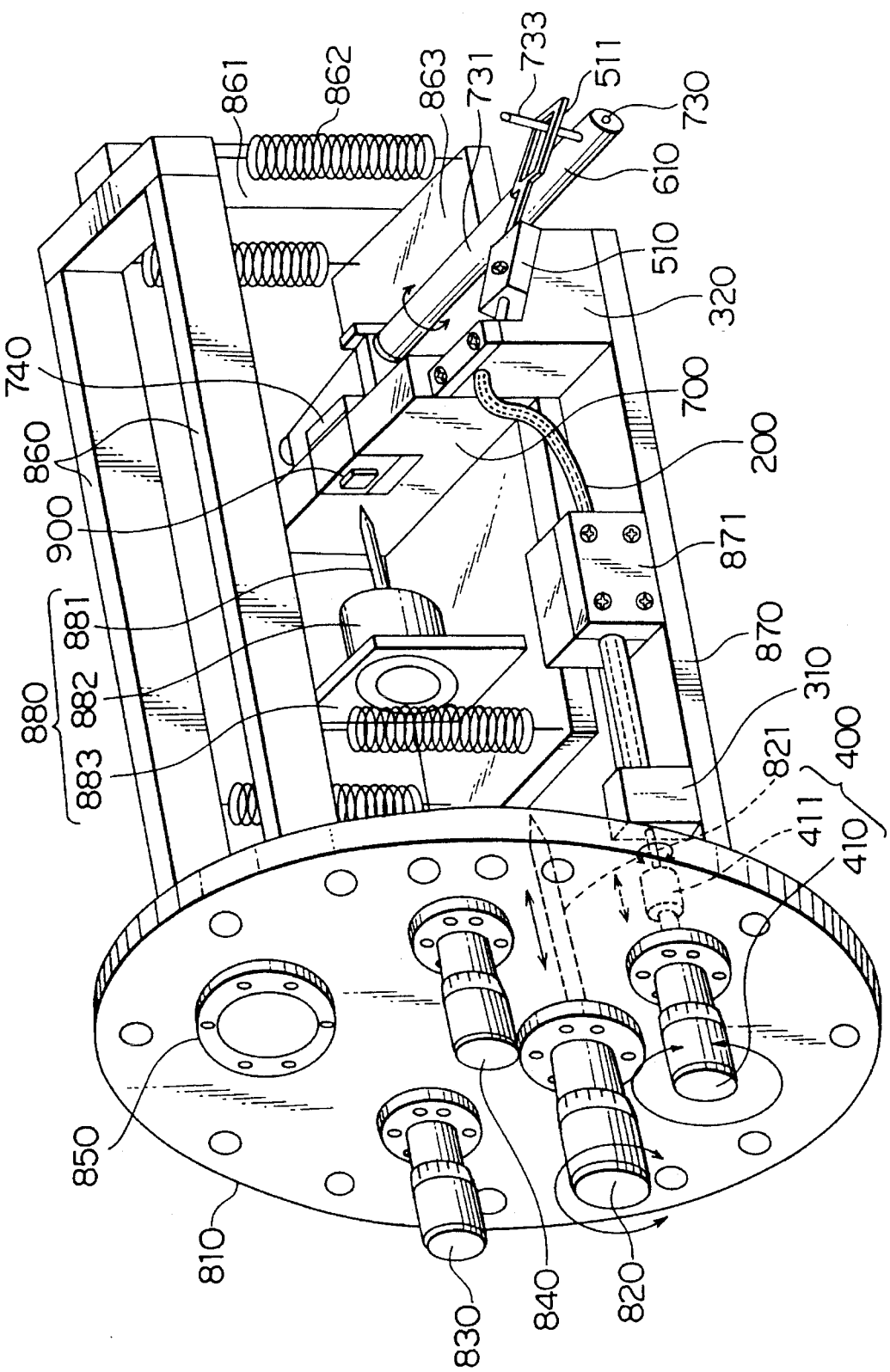
FIG. 12 is a perspective view of a ultra-high vacuum scanning tunneling microscope head using the sample stage in the first embodiment.

FIG. 12 illustrates an ultra-high vacuum scanning tunneling microscope head using the sample stage of the first embodiment. In this head, the linear lead-in portion 410 shown in FIG. 2 as the displacement lead-in portion 400 of the sample stage and the linear displacement lead-out device 510 and the linear coupling portion 610 shown in FIG. 4 as the displacement lead-out portion 500 and the coupling portion 600 are used. The operation of the first embodiment will be described with reference to FIG. 12.

A sample stage flange 810 as a part of a vacuum vessel is provided with the linear lead-in device 410, a clamp linear lead-in device 820, a coarse drive rotary lead-in device 830, a coarse drive linear lead-in device 840 and a sight glass 850 on the air side, and a hanging bar 860 and an arm 870 on the vacuum side. The clamp linear lead-in device 820 has a clamp rod 821, whose leading end is conic, on the vacuum side thereof, and the hanging bar 860 has a clamp plate 861 with a conic projection at the end thereof and vibration-isolating hanging springs 862. A probe portion 880 constituted by the sample carrier portion 700, a probe 881, a scanning piezoelectric device 882 and a piezoelectric device attachment plate 883 is laid on a top plate 863 hung by the hanging springs 862. The flexible shaft 200, the fixtures 310 and 320, the linear displacement lead-out device 510 and a supporter 871 for holding the flexible shaft 200 to prevent the flexible shaft 200 from being twisted and bent by its own weight thereof are mounted to the arm 870. The linear lead-in device connector 411 is disposed between the linear lead-in device 410 and the fixture 310.

First, the fitting and fixing position of the linear displacement lead-out device 510 and the linear coupling portion 610 is adjusted and set. When the leading end of the clamp rod 821 is pressed against one side of the top plate 863 hung by the springs 862 by the clamp linear lead-in device 820, the sample carrier portion 700 and the probe portion 800 mounted on the top plate 863 are pushed together with the top plate 863. When one end of the top plate 863 is brought into contact with the conic projection of the clamp plate 861, the motion of the clamp linear lead-in device 820 is stopped, and the sample carrier portion 700 and the probe portion 800 are brought into a clamp state together with the top plate 863 hung by the hanging springs 862, thereby stopping the swing of the top plate 863 caused by the hanging springs 862.

Figure 13A:
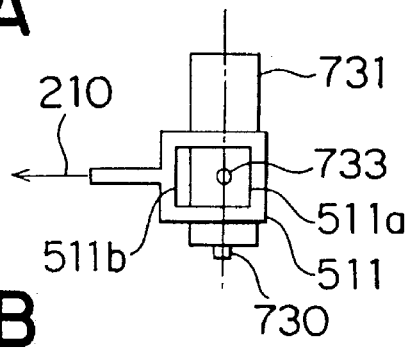
FIGS. 13A, 13B, 14A and 14B are views showing the relationship between a turn engaging rod and a catcher.
Figure 13B:
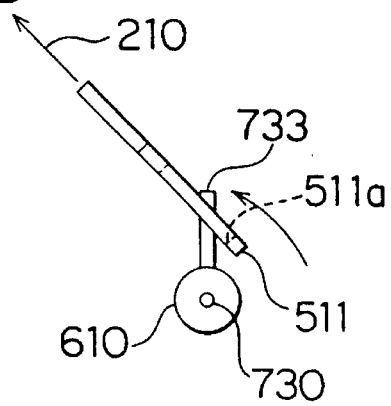

By pulling the inner flexible tube 210 by the linear lead-in device 410 in such clamp state, as shown in FIG. 12, the direction of the turn base 740 is changed so that the sample 900 faces the probe 881. The mount positions of the hanging springs 862, the clamp rod 821 and the clamp plate 861 and the mount angle of the turn shaft engaging rod 733 to the turn shaft fixture 731 are adjusted and set so that the turn engaging rod 733 is positioned as close as possible to and without contact with one inner end 511*a* of the square hole of the catcher 511 as shown in FIGS. 13A and 13B in both the clamp and non-clamp states.

Figure 14A:
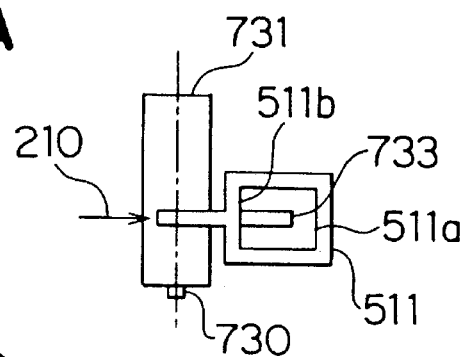
Figure 14B:
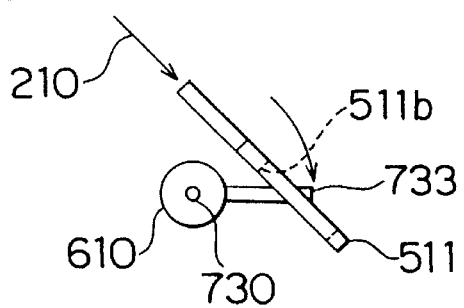

Subsequently, it is ascertained that, when the inner flexible tube 210 is extended by moving the linear lead-in device 410 in the opposite direction in the clamp state and the turn shaft fixture 731 is turned while making the turn engaging rod 733 in contact with the other inner end 511*b* of the square hole of the catcher 511 as shown in FIGS. 14A and 14B, the turn base 740 is gradually turned together with the turn shaft fixture 731 by a couple resulting from the own weight thereof and finally stopped by the turn base stopper 760. Furthermore, it is ascertained that, when the turn shaft fixture 731 is reversely turned by pulling the inner flexible tube 210 again, the turn base 740 is reversely turned by the couple resulting from the own weight thereof as shown in FIGS. 13A and 13B and finally stopped by the contact with the frame 710 and that the turn engaging rod 733 is positioned in the square hole without contact with the catcher 511 in the non-clamp state.

Figure 15:
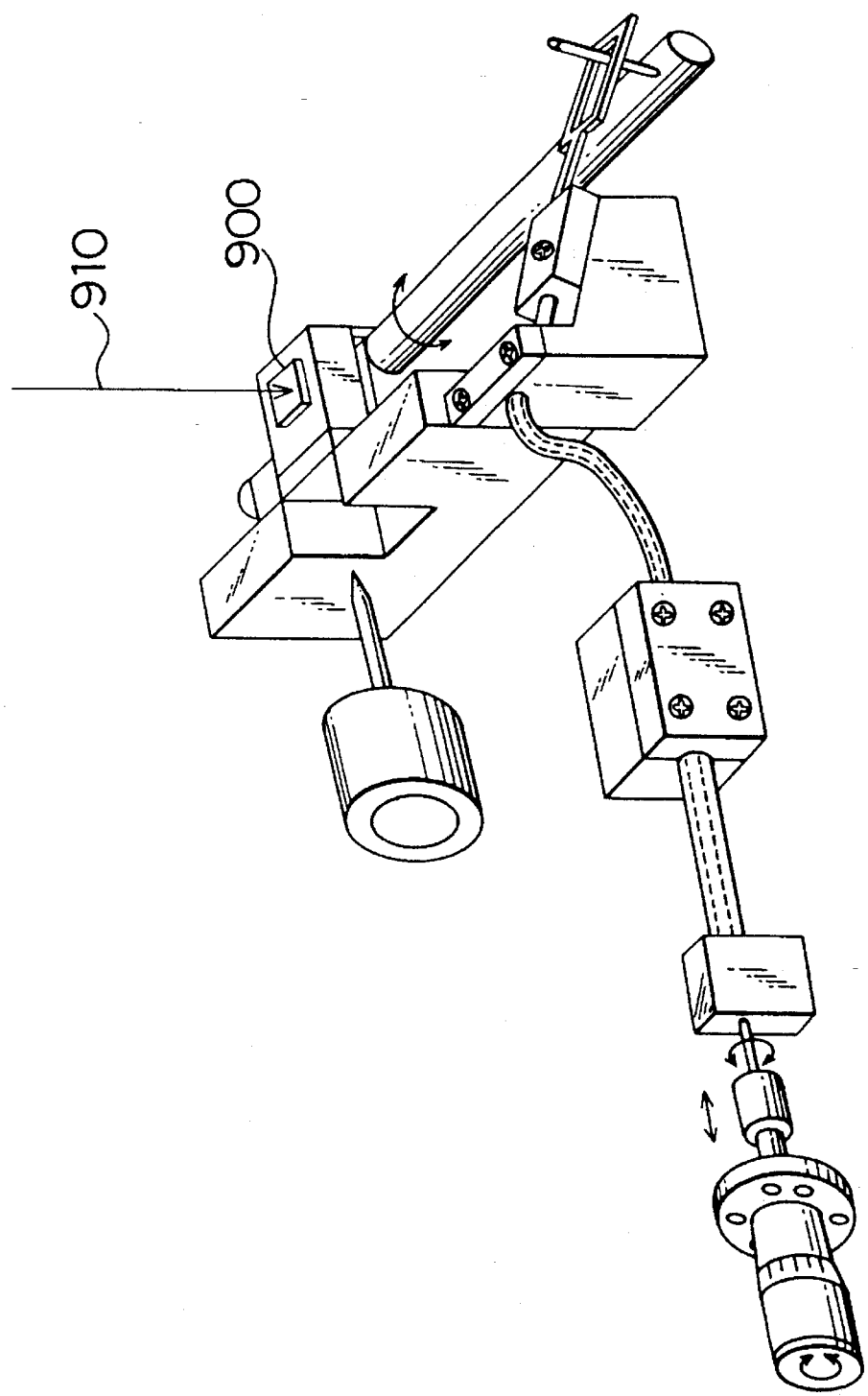
FIGS. 15 to 17 are views showing operations of the scanning tunneling microscope head shown in FIG. 12.
Figure 16:
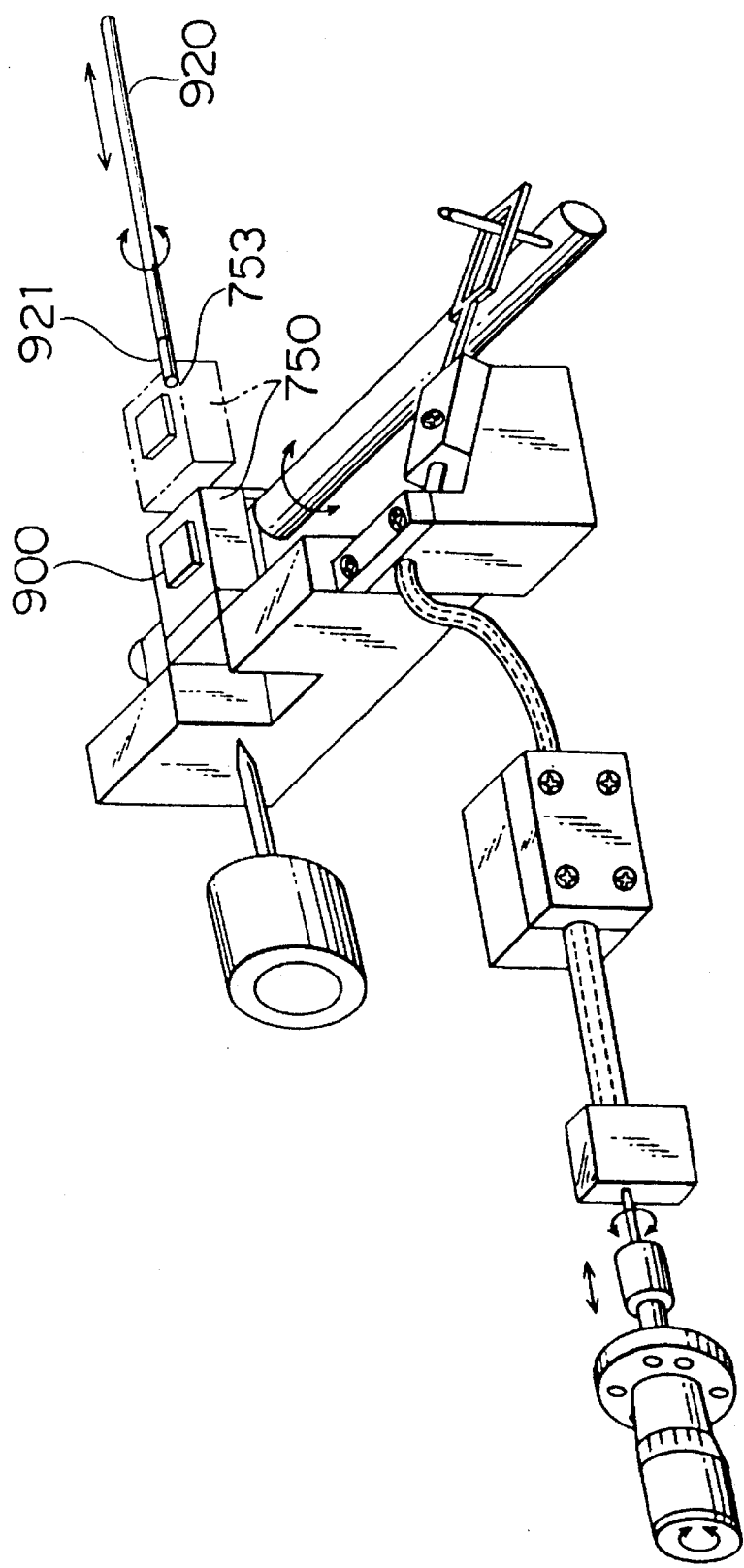
Figure 17:
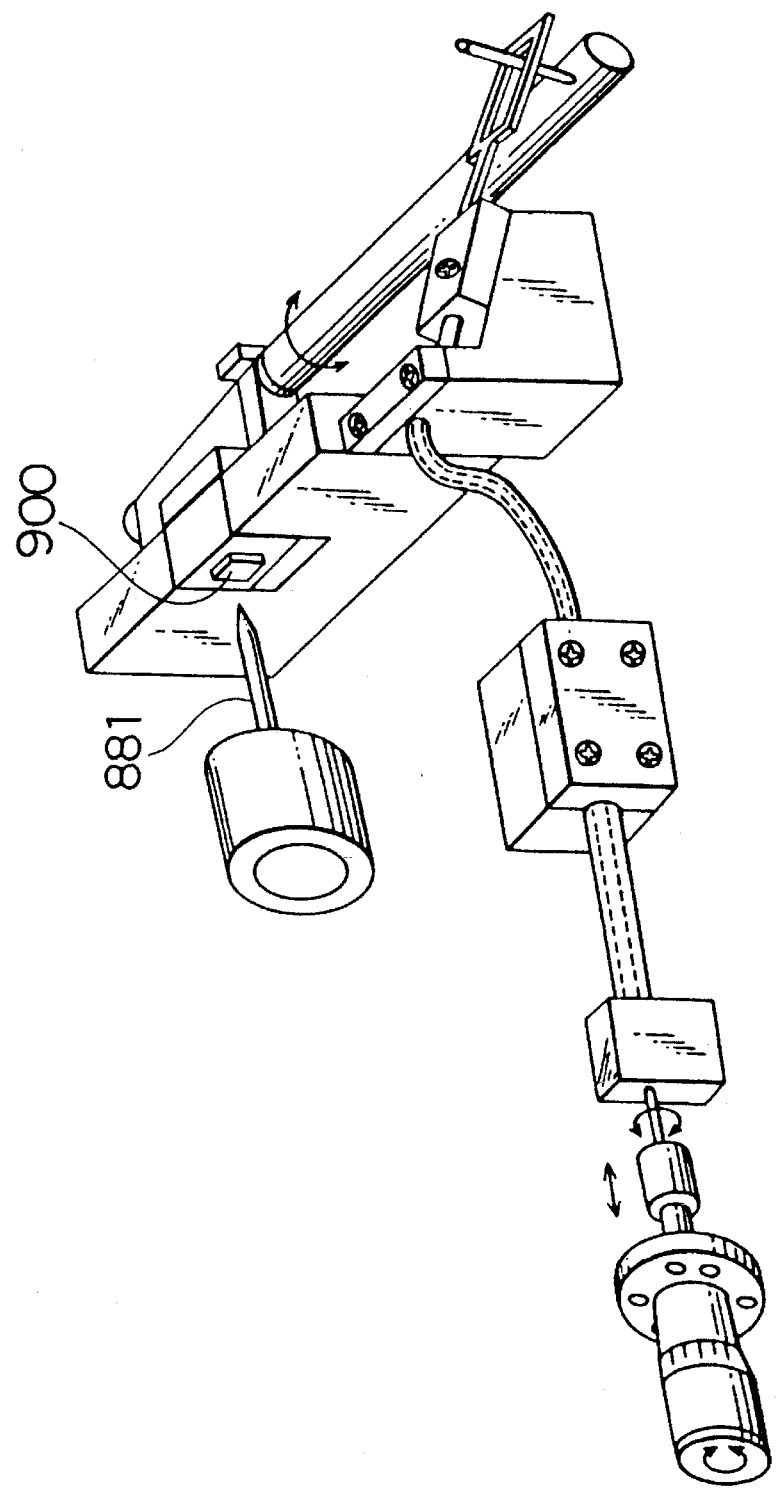

After such adjustment and setting, when the inner flexible tube 210 is advanced by the linear lead-in device 410, the sample 900 is turned together with the turn base 740 to point upward as shown in FIG. 15. By radiating, for example, an infrared ray 910 onto the plane of the sample 900 in this state, the sample 900 can be heated and cleaned. Furthermore, the sample 900 can be exchanged with another by screwing a sample exchange male screw 921 formed at the leading end of a sample exchange rod 920 to the sample exchange female screw 753 of the sample carrier 750 and inserting and extracting the sample carrier 750 into and from the turn base 740 as shown in FIG. 16. On the other hand, when the inner flexible tube 210 is retracted by the linear lead-in device 410, the sample 900 is turned toward the probe 881 together with the turn base 740 as shown in FIG. 17. In this state, the scanning tunneling microscope can work.

Materials and dimensions of the components of the sample stage in the first embodiment will be described in detail. Both the outer flexible tube 220 and the inner flexible tube 210 constituting the flexible shaft 200 are shaped like a spring, and the material thereof is a C hard steel wire (JIS-G3521) which has large tensile strength and torsional stress and high abrasion resistance, or a stainless steel wire for a vacuum. The inner flexible tube 210 is 0.3 mm in wire diameter, 1.0 mm in outer spring diameter, 0 mm in spacing between turns and 20 mm in bend radius, and the outer flexible tube 220 is 0.6 mm in wire diameter, 2.5 mm in outer spring diameter and 0.3 mm in winding pitch. The bend radius of the flexible shaft 200 is 20 mm. If the bend radius may be larger, the outer flexible tube 220 is made of a coil of a flat steel wire so that the inner flexible tube 210 can smoothly slide inside the outer flexible tube 220. In order to further promote the sliding, a perfluorinated grease, FOMBLIN, whose vapor pressure is less than $10^{-9}$ Pa may be interposed as a lubricant between the inner flexible tube 210 and the outer flexible tube 220.

The fixing members 311 and 312 and the screws 313 constituting the fixtures 310 and 320, the linear lead-in portion connector 411 and the screws 412 are made of stainless steel (SUS-304 and JIS-G-4303, referred to as SUS hereinafter).

The linear movement of the linear lead-in device 410 used as the displacement lead-in portion 400 is 20 mm and the rotation angle of the rotary lead-in device 420 is not limited. The linear lead-in device 410 and the rotary lead-in device 420 each have a drive shaft diameter of 6 mm and a connecting flange diameter of φ 34ICF, and either of these lead-in devices is attached to the sample stage flange 810 of φ 203ICF shown in FIG. 12.

The linear displacement lead-out device 510 or the rotary displacement lead-out device 520 as the displacement. lead-out portion 500 and the linear coupling portion 610 or the rotary coupling portion 620 as the coupling portion 600 are made of SUS.

The square hole of the catcher 511 used in the displacement lead-out device 510 shown in FIG. 12 is 5 mm in width and 9 mm in length, and the turn engaging rod 733, made of steel wire (piano wire of JIS-G3522, referred to as piano wire) having a diameter of 1 mm, is fitted therein. The turn engaging rod 733 is fixed in a hole formed on the side of the turn shaft fixture 731 in an interference fit.

The frame 710 as a component of the sample carrier portion 700 is made of SUS, and has a width of 60 mm, a height of 50 mm and a depth of 8 mm. A square slot having a width of 10+0.05 mm, a height of 13 mm and a depth of 8 mm is formed in the center of the top of the frame 710 to insert and extract the sample carrier 750 therein and therefrom. A void is formed between the square slot of the frame 710 and the sample carrier 750 by making the width of the sample carrier 750 smaller than that of the square slot so that the turn can be kept even if thermal expansion is caused by the rise of temperature in degassing.

The turn base fixture 720 made of SUS with outward dimensions of 205 mm in width, 14 mm in height and 6 mm in depth is U-shaped with a square slot having a width of 10+0.05 mm, a height of 8 mm and a depth of 6 mm, and is fixed to the frame 710 by screws. The turn shaft 730 made of piano wire having a diameter of 1.5 mm is inserted in holes respectively formed in the turn base fixture 720 and the turn base 740 made of SUS.

The sample carrier 750 is made of SUS and shaped in a rectangular parallelepiped of 10−0.05 mm in width, 10 mm in height and 8 mm in depth. The radius of curvature of the neck slot 742 of the sample carrier insertion pin 741 made of SUS, whose leading end is curved in a radius of curvature of 1.5 mm, is 0.3 mm and the U-shaped insertion pin presser spring 751 made of piano wire having a diameter of 0.2 mm is fitted in the neck slot 742. The sample presser bar flat spring 901 is made of a phosphor bronze plate (JIS-H3110) having a thickness of 0.2 mm and fixed onto the sample carrier 750 by four screws (M1.2). The turn base stopper 760 and the turn shaft fixtures 731 and 732 are each made of SUS. The turn shaft fixtures 731 and 732 each have a diameter of 5.8 mm, and the turn shaft 730 is fixed thereto by screws (M1.2).

The total weight of a rotary body constituted by the sample carrier 750, the sampler presser bar flat spring 901, the turn base 740, the sample carrier insertion pin 741 and the insertion pin presser spring 751 is approximately 12 g. The turn base 740 having an average surface roughness Ra (JIS-B0601) of less than 0.10a is laid on the plane of the square slot of the frame 710 having the same average surface roughness, thereby functioning as an STM.

Second Embodiment

Figure 18A:
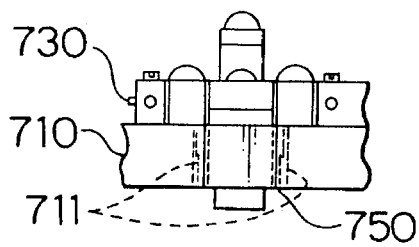
FIGS. 18A to 18C are respectively top, front and side views of a sample carrier portion according to a second embodiment of the present invention.
Figure 18B:
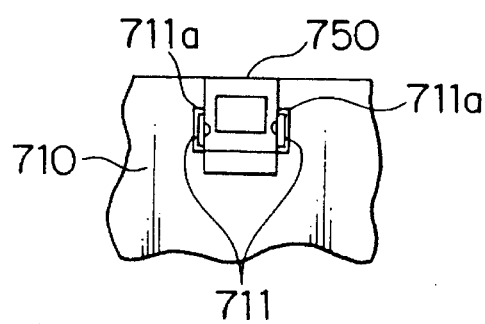
Figure 18C:
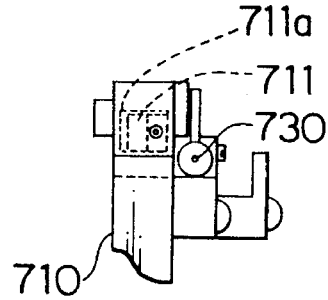

FIGS. 18A to 18C are respectively top, front and side views showing a sample carrier portion in a sample stage according to a second embodiment of the present invention. A square slot in which the turn base 740 and the sample carrier 750 are housed is formed on the top of the frame 710, and a pair of slots 711a extending from the front side to the rear side of the frame 710 are formed on planes of the square slot. Ends of sample carrier presser bar flat springs 711 as sample carrier presser members in the present invention are respectively fixed in the slots 711a by screws.

When the sample carrier 750 is turned and inserted in the square slot of the frame 710, both sides thereof are pressed by the elastic forces of the sample carrier presser bar flat springs 711 mounted in the slots 711a. Therefore, the change of displacement of the turn shaft 730 in the axial direction is restricted, and a rotary body constituted by the sample carrier 750, the sample presser bar flat spring 901, the turn base 740, the sample carrier insertion pin 741 and the insertion pin presser spring 751 can perform a reliable STM operation.

Figure 19A:
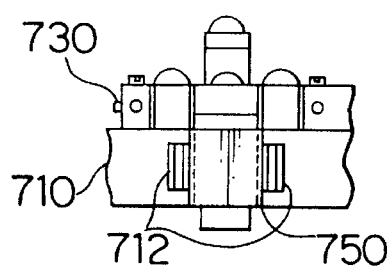
FIGS. 19A to 19C are respectively top, front and side views of a sample carrier portion according to a first variation of the second embodiment.
Figure 19B:
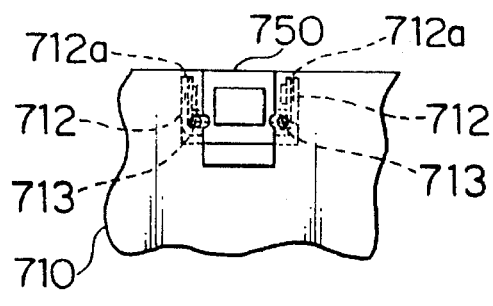
Figure 19C:
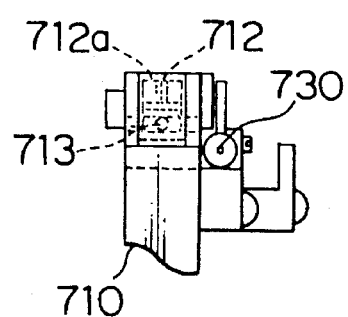

FIGS. 19A to 19C illustrates a variation of the sample carrier portion according to the second embodiment. In the variation shown in FIGS. 19A to 19C, a pair of slots 712a extending downward from the top of the frame 710 are formed in the square slot of the frame 710, and ends of sample carrier presser bar flat springs 712 each made of plywood are respectively screwed in the slots 712a. Furthermore, metallic balls 713 are put between the other ends of the sample carrier presser bar flat springs 712 and both sides of the sample carrier 750. This serves to smoothly turn and insert the sample carrier 750 in the square slot of the frame 710, thereby achieving a reliable STM operation as described above.

Figure 20A:
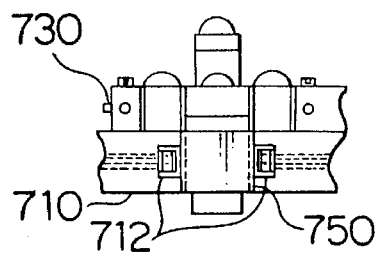
FIGS. 20A to 20C are respectively top, front and side views of a sample carrier portion according to a second variation of the second embodiment.
Figure 20B:
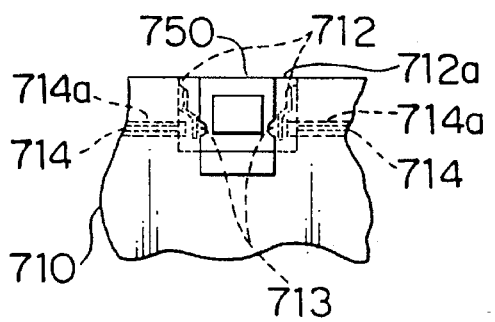
Figure 20C:
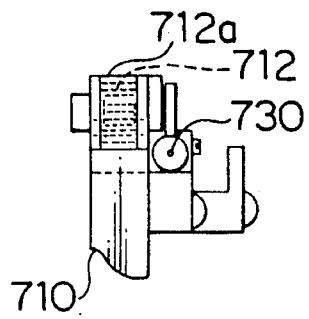

In another variation shown in FIGS. 20A to 20C, pits 714a are further formed to pierce the square slot and the slots 712a in the variation shown in FIGS. 19A to 19C, and compression springs 714 are mounted in the pits 714a. The metallic balls 713 held by the sample carrier presser bar flat springs 712 are urged toward the sample carrier 750 by the compression springs 714. Therefore, the change of position of the turn shaft 730 in the axial direction is restricted and the rotary body including the sample carrier 750 can perform a reliable STM operation.

Figure 21A:
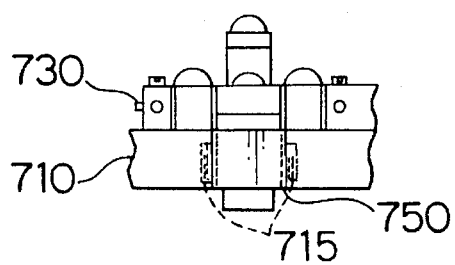
FIGS. 21A to 21C are respectively top, front and side views of a sample carrier portion according to a third variation of the second embodiment.
Figure 21B:
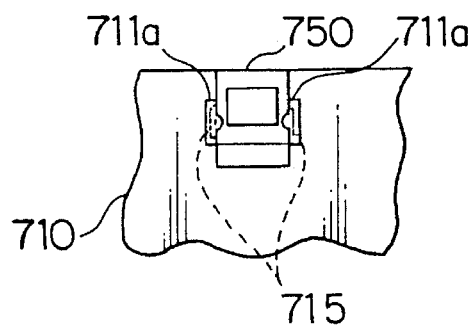
Figure 21C:
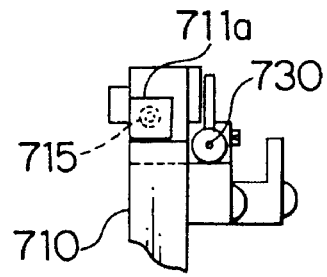

In still another variation shown in FIGS. 21a to 21C, magnets 715 are respectively fixed by an adhesive in the slots 711a formed in the square slot to extend from the front to the rear. Since the magnets 715 in the slots 711a attract both sides of the sample carrier 750, a reliable STM operation is achieved.

Materials and dimensions of the components of the sample carrier portion 700 in the second embodiment will now be described in detail. The slots 711 a and 712 are each 3.5 mm in width and 3 mm in depth, and the pits 714a are each 2.5 mm in diameter and 8 mm in depth. The sample carrier presser bar flat springs 711 are each made of a phosphor bronze plate (JIS-H3110) having a thickness of 0.1 mm and a width of 3 mm. Each of the sample carrier presser bar flat springs 712 is made of a two-ply plate of the same phosphor bronze as mentioned above, and has a hole of 1.8 mm in diameter in a portion for holding the metallic ball 713. The metallic balls 713 each are made of a rigid ball (JIS-B1501) for a ball bearing having a diameter of 2 mm. Each of the compression springs 714 is a coil spring of 0.2 mm in wire diameter, 2.0 mm in outer diameter, 16 g/mm in spring constant and 12 mm in free length. As the magnets 715, a rare earth magnet, such as a neodymium (Nd-Fe-B) magnet or a samarium cobalt (Sm-Co) magnet, having a diameter of 2mm, a thickness of 3 mm and a magnetic force of 2500 to 3200G, is used.

A ball made of a precious stone, such as ruby, may be used instead of the metallic balls 713. Furthermore, the metallic balls 713 made of bearing rigid balls may be given the same effect as that of the magnets 715 in the variation shown in FIGS. 21A to 21C by being magnetized.

If the metallic balls 713 in the variation shown in FIGS. 21A to 21C are magnetized, the frame 710 and the sample carrier 750 are made of highly permeable stainless steel (SUS430, JIS-G4303), or highly permeable Invar (Fe: 64%, Ni: 36%) or Super Invar (Fe: 63%, Ni: 32%, Co: 5%) having a small coefficient of thermal expansion, and a magnet circuit is closed when the sample carrier 750 is turned and inserted in the square slot of the frame 710.

As the adhesive for fixing the magnets 715 in the slots 711a, for example, a curing agent consisting of thixotropic epoxy resin and aromatic amine or a vacuum leak inhibitor, Torr-Seal, having a low vapor pressure less than $10^{-7}$ Pa is used.

Third Embodiment

Figure 22:
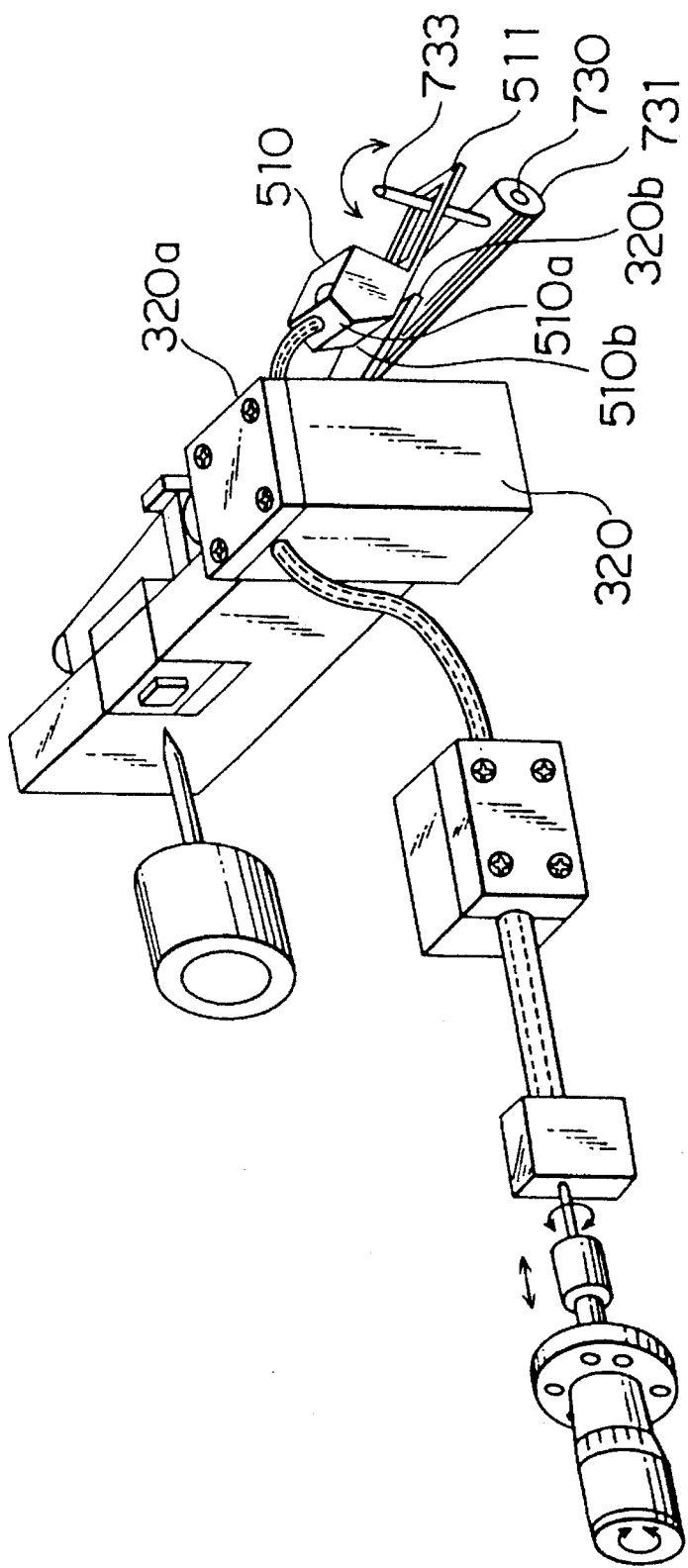
FIG. 22 is a perspective view of a sample stage according to a third embodiment.

FIG. 22 illustrates a sample stage according to a third embodiment of the present invention. Referring to FIG. 22, numerals 320a, 320b, 510a and 510b respectively denote a fixture contact portion where the fixture 320 is in contact with the linear displacement lead-out device 510, a guide portion, a linear displacement lead-out contact portion where the linear displacement lead-out device 510 is in contact with the turn shaft fixture 731, and a guide contact portion. The fixture 731 and the linear displacement lead-out device 510 are so shaped that the catcher 511 is put in a horizontal position and the turn engaging rod 733 escapes from the square hole of the catcher 511 when the inner flexible tube 210 of the flexible shaft 200 is pulled.

Figure 23A:
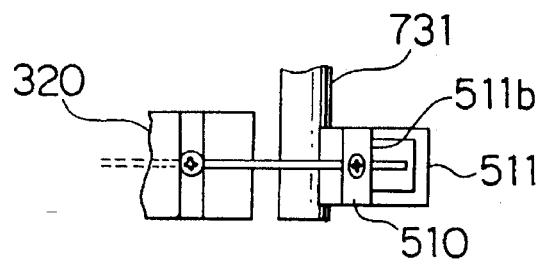
FIGS. 23A, 23B, 24A, 24B, 25A and 25B are views showing a displacement transmission means in the third embodiment.
Figure 23B:
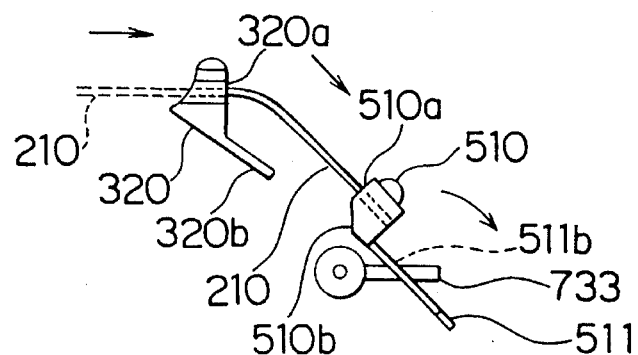
Figure 24A:
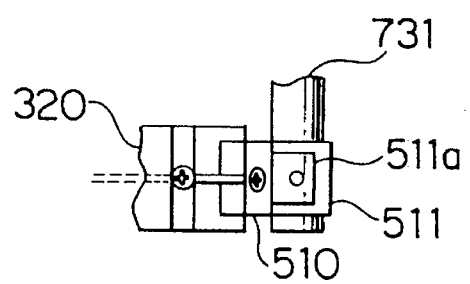
Figure 24B:
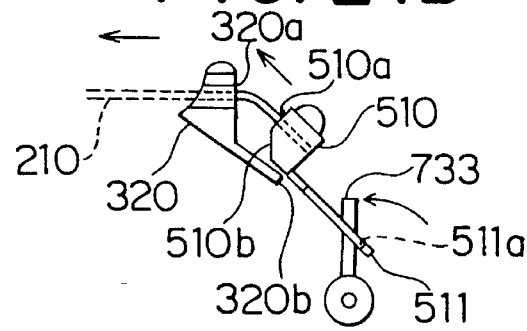
Figure 25A:
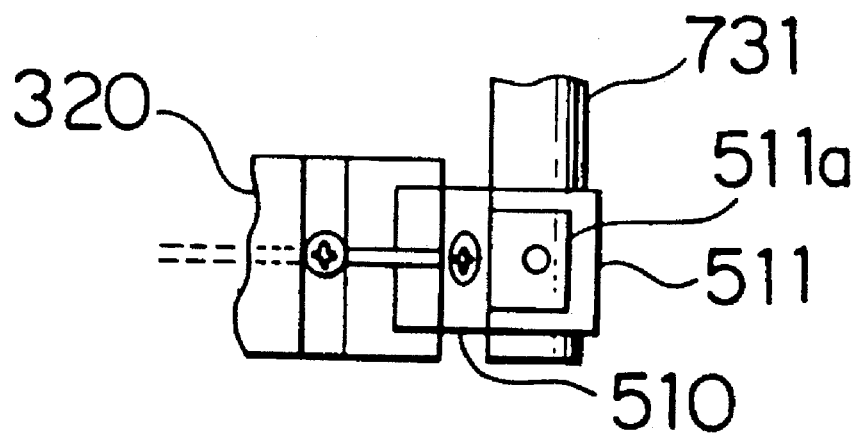
Figure 25B:
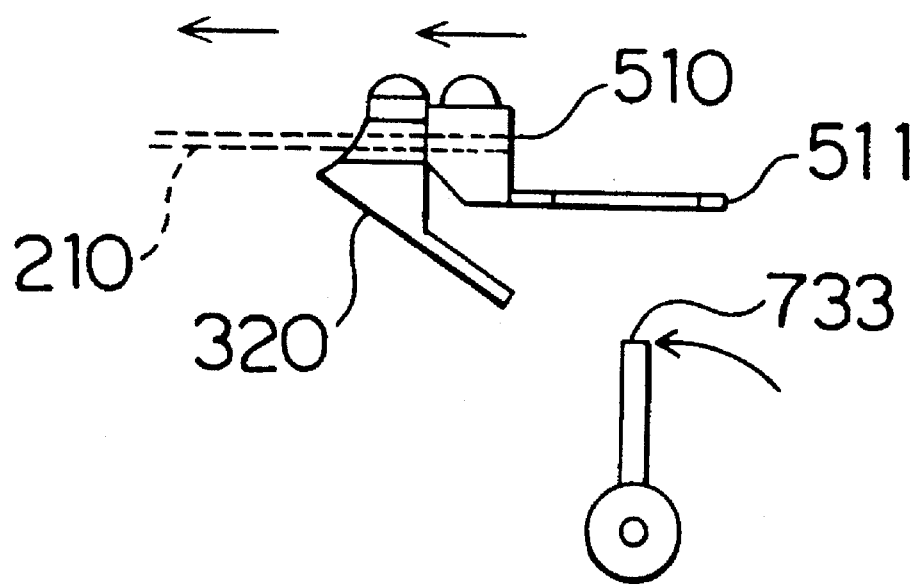

The operation of the sample stage in the third embodiment will now be described. When the inner flexible tube 210 is advanced, as shown in FIGS. 23A and 23B, the turn shaft fixture 731 is turned while the turn engaging rod 733 is kept in contact with the inner end 511b of the square hole of the catcher 511. To the contrary, when the inner flexible tube 210 is pulled, as shown in FIGS. 24A and 24B, the turn shaft fixture 731 is reversely turned while the turn engaging rod 733 is kept in contact with the other inner end 511a of the square hole of the catcher 511. During the reverse turn, the guide contact portion 510b of the linear displacement lead-out device 510 runs onto the guide portion 320b of the fixture 320, and the inner end 571a of the square hole of the catcher 511 is lifted up. When the inner flexible tube 210 is further pulled, as shown in FIGS. 25A and 25B, the linear displacement lead-out device 510 is brought into planar contact with the fixture contact portion 320a, the catcher 511 is put in a horizontal position, and the turn engaging rod 733 completely escapes from the square hole of the catcher 511.

According to the third embodiment, since the turn engaging rod 733 completely escapes from the square hole of the catcher 511, it is not in contact with the square hole of the catcher 511 even if vibration is applied to the whole STM in operation. Therefore, it is possible to continue stable operation for a long time.

Fourth Embodiment

Figure 26:
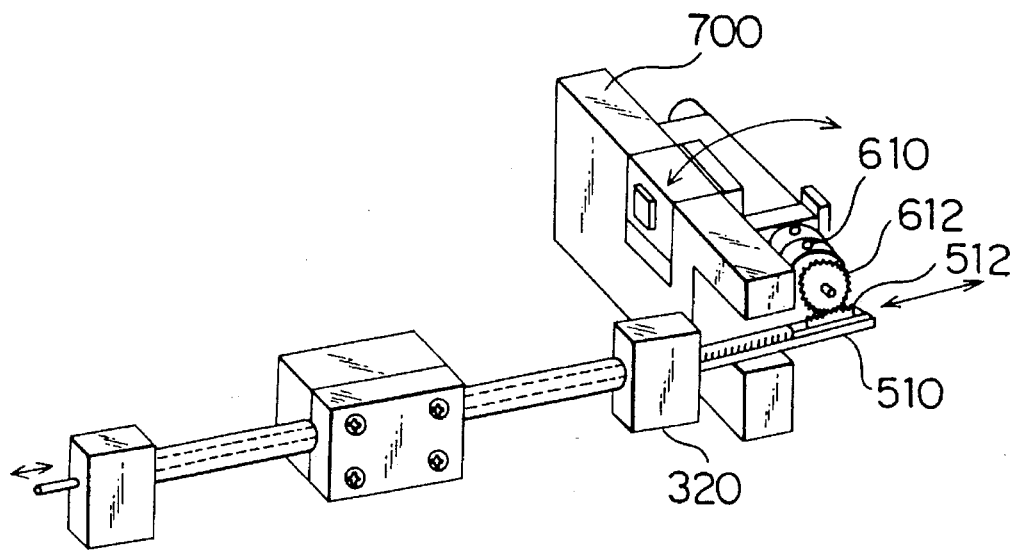
FIG. 26 is a perspective view of a sample stage according to a fourth embodiment.

FIG. 26 illustrates a sample stage according to a fourth embodiment of the present invention. In the fourth embodiment, the displacement led in the inner flexible shaft 210 of the flexible shaft 200 is transmitted to the sample carrier portion 700 through a gear transmission mechanism. Referring to FIG. 26, a rack 512 is mounted in the linear displacement lead-out device 510, and a pinion 612 is mounted in the linear coupling portion 610. The rack 512 and the pinion 612 form a rack and pinion structure. The advance and retraction of the linear displacement lead-out device 510 are converted into the rotation of the pinion 612 through the rack 512, thereby turning the sample 900 in the sample carrier portion 700.

Figure 27:
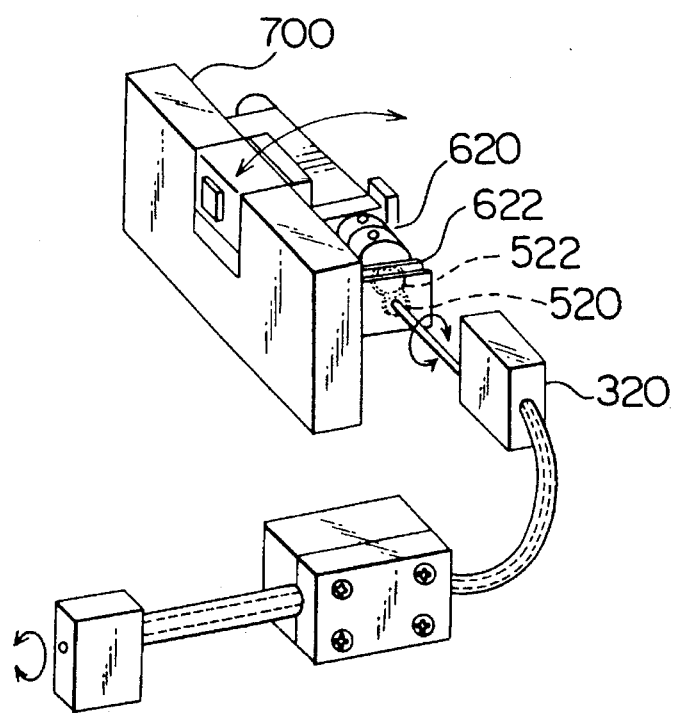
FIG. 27 is a perspective view of a sample stage according to a variation of the fourth embodiment.
Figure 28:
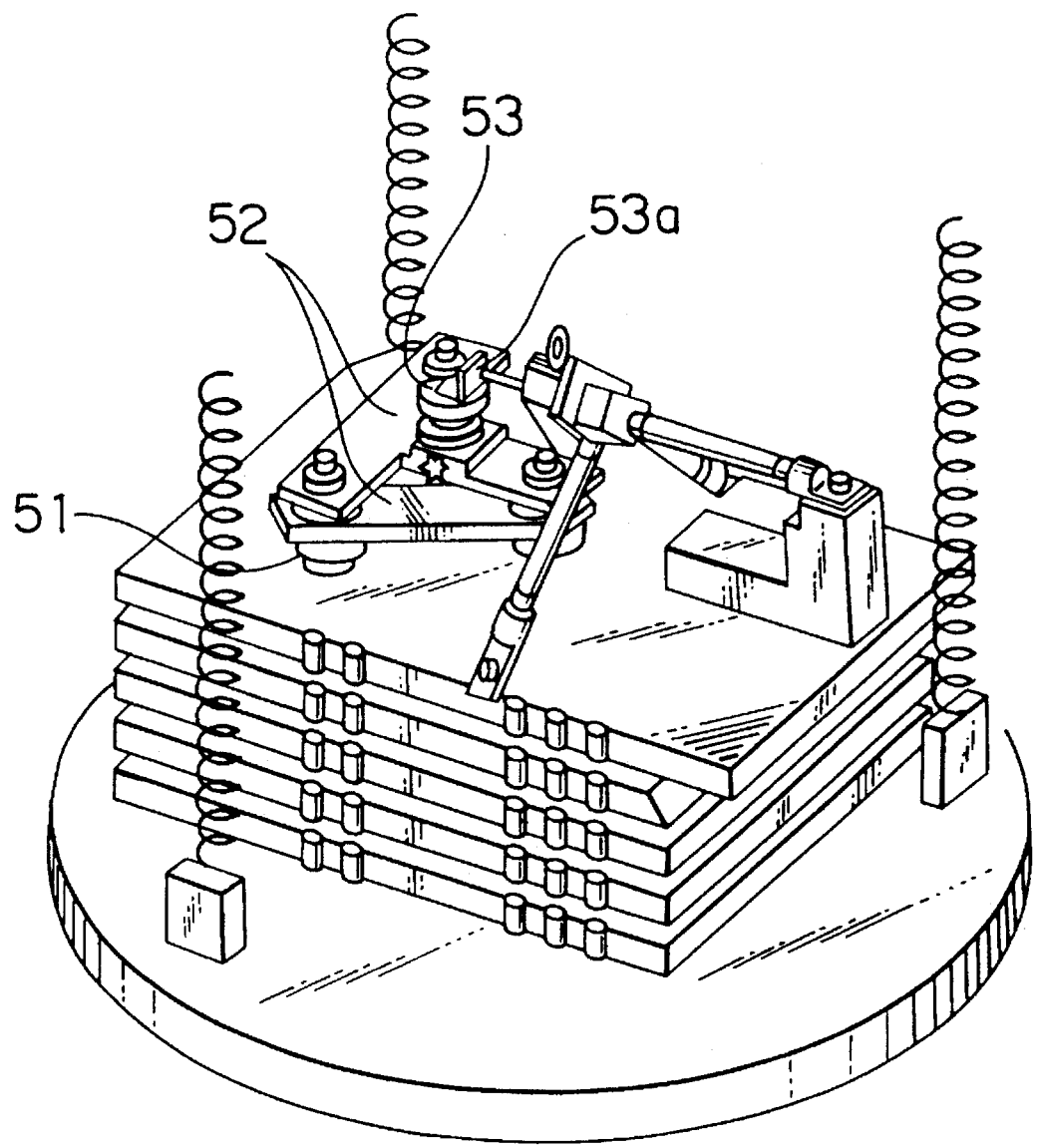
FIG. 28 is a perspective view of a conventional sample stage.
Figure 29A:
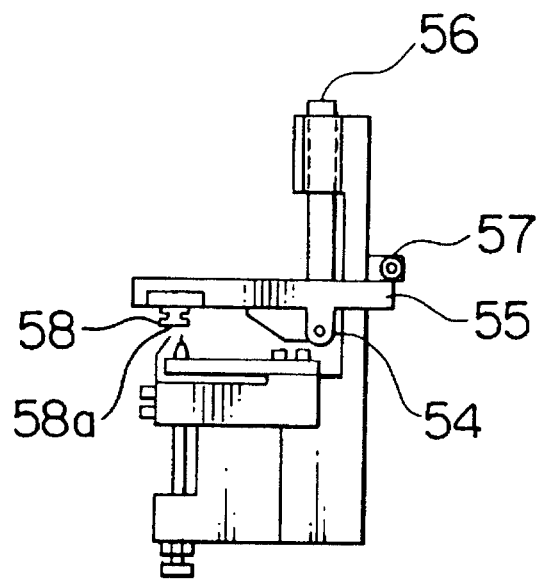
FIG. 29A is a side view of another conventional sample stage in operation of a STM and FIG. 29B is a side view showing a state in which the direction of a sample plane of the sample stage shown in FIG. 29A is changed.
Figure 29B:
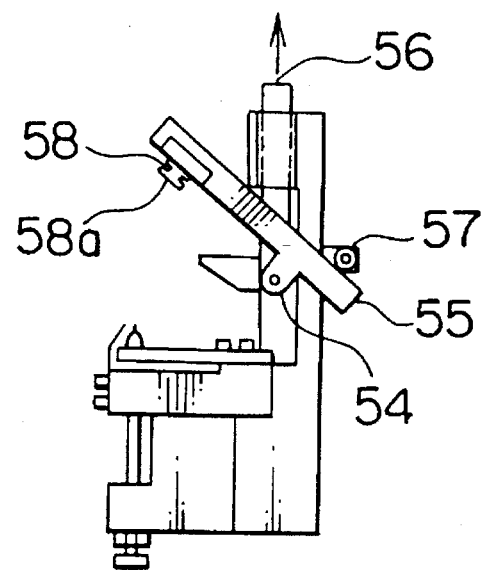

As shown in FIG. 27, the rotation led out by the rotary displacement lead-out device 520 may be transmitted to the sample carrier portion 700 through a gear transmission mechanism. Referring to FIG. 27, a main driving gear 522 formed in the rotary displacement lead-out device 520 and a driven gear 622 formed in the rotary coupling portion 620 form a spur gear transmission structure. The rotation of the main driving gear 522 in the rotary displacement lead-out device 520 is transmitted to the driven gear 622 to turn the sample 900 in the sample carrier portion 700.

According to the fourth embodiment, since the power is transmitted by using gears, the displacement led in the inner flexible tube 210 of the flexible shaft 200 is transmitted to the sample carrier portion 700 with reliability.

Though the direction of the plane of the sample 900 is changed between the horizontal direction and the vertical direction in the above embodiments, it may be arbitrarily changed by changing the axial mount direction of the turn shaft 730 in the sample carrier portion 700.

Furthermore, though the sample stage of the present invention is applied to an STM in the above embodiments, the present invention is not limited to the embodiments and may be applied as a sample stage of, for example, an atomic force microscope.

What is claimed is:

1. A sample stage of a scanning probe microscope head comprising:

a flexible shaft comprising an inner flexible tube and an outer flexible tube;

fixtures for fixing both ends of the outer flexible tube;

a displacement lead-in portion for displacing one end of the inner flexible tube relative to the outer flexible tube and comprising a linear lead-in device for linearly displacing the inner flexible tube relative to the outer flexible tube in the longitudinal direction thereof;

a sample carrier portion for holding a sample and changing the direction of a plane of the sample by turning about a turn axis; and displacement transmitting means connected to the other end of the inner flexible tube for transmitting the displacement led into the inner flexible tube by the displacement lead-in portion to the sample carrier portion to turn the sample carrier about the turn axis.

2. A sample stage as claimed in claim 1 wherein the displacement transmitting means has an engaging rod connected to the turn axis of the sample carrier portion and a catcher connected to the other end of the inner flexible tube, the catcher is engaged with the engaging rod at one end of the linear displacement of the inner flexible tube led by the displacement lead-in portion, and the catcher is disengaged from the engaging rod at the other end thereof.

3. A sample stage as claimed in claim 1 wherein the displacement transmitting means includes a gear transmission mechanism for transmitting the displacement lead in the flexible tube by the displacement lead-in portion to the sample carrier portion.

4. A sample stage as claimed in claim 3 wherein the gear transmission mechanism is a rack and pinion structure.

5. A sample stage of a scanning probe microscope head, comprising:

a flexible shaft comprising of an inner flexible tube and an outer flexible tube;

fixtures for fixing both ends of the outer flexible tube;

a displacement lead-in portion for displacing one end of the inner flexible tube relative to the outer flexible tube;

a sample carrier portion comprising a frame, a sample carrier for supporting a sample supported by the frame for rotation about an axis between a first position and a second position for observation of the sample by a scanning probe microscope head, and two sample carrier presser members supported by the frame and disposed on opposite sides of the sample carrier, each sample carrier pressure member comprising a spring applying a force against the sample carrier in the second position to resist movement of the sample carrier parallel to the axis; and displacement transmitting means connected to the other end of the inner flexible tube for transmitting the displacement led into the inner flexible tube by the displacement lead-in portion to the sample carrier portion to rotate the sample carrier about the axis.

6. A sample stage as claimed in claim 5 wherein the frame has a first slot for housing the sample carrier, side slots are formed on opposite sides of the first slot, and one of the sample carrier presser members is mounted in each of the side slots.

7. A sample stage as claimed in claim 6 wherein each sample carrier presser member comprises a bar flat spring disposed in one of the side slots.

8. A sample stage as claimed in claim 6 wherein each sample carrier presser member includes a bar flat spring made of plywood and a ball supported by the bar flat spring for contacting the sample carrier.

9. A sample stage as claimed in claim 6 wherein each sample carrier presser member includes a ball and a compression spring for urging the ball toward the sample carrier.

10. A sample stage of a scanning probe microscope head, comprising:

a flexible shaft comprising an inner flexible tube and an outer flexible tube;

fixtures for fixing both ends of the outer flexible tube;

a displacement lead-in portion for displacing one end of the inner flexible tube relative to the outer flexible tube;

a sample carrier portion comprising a frame, a sample carrier for supporting a sample supported by the frame for rotation about an axis between a first position and a second position for observation of the sample by a scanning probe microscope head, and two magnets mounted on the frame on opposite sides of the sample carrier and opposing the sample carrier when the sample carrier is in the second position for resisting movement of the sample carrier parallel to the axis; and displacement transmitting means connected to the other end of the inner flexible tube for transmitting the displacement led into the inner flexible tube by the displacement lead-in portion to the sample carrier portion to turn the sample carrier about the turn axis.

11. A sample stage for a scanning probe microscope head comprising:

a sample carrier portion comprising a frame, a sample carrier rotatably mounted on the frame, and a rotating shaft secured to the sample carrier for rotating the sample carrier;

a flexible shaft;

a rod secured to the rotating shaft and extending transversely with respect to an axis of the rotating shaft;

a catcher connected to an end of the flexible shaft and having an opening for engaging the rod; and a support fixture supporting the end of the flexible shaft for movement in a longitudinal direction of the flexible shaft between a position in which the opening in the catcher surrounds the rod and a position in which the opening in the catcher is spaced from the rod.

12. A sample stage as claimed in claim 11 wherein the support fixture includes a guide which pivots the catcher away from the rod when the catcher contacts the guide.

13. A sample stage as claimed in claim 12 wherein the guide comprises a ramp for slidably supporting the catcher.

14. A sample stage for a scanning probe microscope head comprising:

a sample carrier portion comprising a frame and a sample carrier rotatably mounted on the frame for rotation about an axis;

a flexible shaft;

a first rotary connecting member connected to the sample carrier and a second rotary connecting member connected to an end of the flexible shaft and engaged with the first rotary connecting member to transmit rotation of the flexible shaft to the sample carrier, one of the connecting members comprising first and second pins projecting parallel to the axis towards the other connecting member, and the other connecting member comprising a projection inserted loosely between the pins of the one connecting member and engageable with at least one of the pins when the one connecting member is rotated to a predetermined angle with respect to the, other connecting member.

15. A sample stage as claimed in claim 14 wherein the projection comprises a flat plate.

* * * * *